US010521136B2

(12) United States Patent
Kim

(10) Patent No.: US 10,521,136 B2
(45) Date of Patent: Dec. 31, 2019

(54) MEMORY SYSTEM AND METHOD FOR OPERATING THE SAME FOR INCREASING A READ RECLAIM COUNT VALUE

(71) Applicant: SK hynix Inc., Gyeonggi-do (KR)

(72) Inventor: Se-Hyun Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/701,656

(22) Filed: Sep. 12, 2017

(65) Prior Publication Data
US 2018/0181326 A1 Jun. 28, 2018

(30) Foreign Application Priority Data
Dec. 28, 2016 (KR) .................. 10-2016-0181180

(51) Int. Cl.
G06F 3/06 (2006.01)
G11C 16/10 (2006.01)
G11C 29/00 (2006.01)
G11C 16/26 (2006.01)
G06F 11/07 (2006.01)
G11C 16/34 (2006.01)
G06F 11/10 (2006.01)

(52) U.S. Cl.
CPC ............ G06F 3/0619 (2013.01); G06F 3/064 (2013.01); G06F 3/0679 (2013.01); G06F 11/073 (2013.01); G06F 11/1048 (2013.01); G11C 16/107 (2013.01); G11C 16/26 (2013.01); G11C 16/3404 (2013.01); G11C 29/82 (2013.01)

(58) Field of Classification Search
CPC .. G06F 3/0619; G06F 11/1048; G06F 11/073; G06F 3/064; G06F 3/0679; G11C 16/3404; G11C 16/26; G11C 29/82; G11C 16/107
See application file for complete search history.

(56) References Cited

U.S. PATENT DOCUMENTS

| 2013/0031443 | A1* | 1/2013 | Oh ..................... G11C 11/5628 714/773 |
| 2014/0101372 | A1* | 4/2014 | Jung .................. G06F 12/0253 711/103 |
| 2016/0203047 | A1* | 7/2016 | No ..................... G06F 11/1068 714/764 |
| 2016/0217032 | A1* | 7/2016 | Yum ................... G06F 11/1048 |
| 2017/0177425 | A1* | 6/2017 | Jei ......................... G06F 11/076 |

FOREIGN PATENT DOCUMENTS

| KR | 1020090042039 | 4/2009 |
| KR | 1020140103755 | 8/2014 |

* cited by examiner

Primary Examiner — Jerome Leboeuf
(74) Attorney, Agent, or Firm — IP & T Group LLP

(57) ABSTRACT

A memory system includes: a memory device including a plurality of memory blocks; and a controller suitable for selecting one or more first memory blocks based on a predetermined condition among the plurality of the memory blocks in a booting section, and increasing a read reclaim count value of one or more second memory blocks among the one or more first memory blocks for which a number of failed bits of read data exceeds a predetermined threshold.

18 Claims, 10 Drawing Sheets

MEMORY SYSTEM AND METHOD FOR OPERATING THE SAME FOR INCREASING A READ RECLAIM COUNT VALUE

CROSS-REFERENCE TO RELATED APPLICATIONS

The present application claims priority of Korean Patent Application No. 10-2016-0181180, filed on Dec. 28, 2016, which is incorporated herein by reference in its entirety.

BACKGROUND

1. Field

Exemplary embodiments of the present invention relate to a memory system and a method for operating the memory system.

2. Description of the Related Art

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory or an auxiliary memory of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid-state drives (SSD).

SUMMARY

Embodiments of the present invention are directed to a memory system capable of performing a read reclaim operation even when a sudden power-off (SPO) occurs, and a method for operating the memory system.

In accordance with an embodiment of the present invention, a memory system may include: a memory device including a plurality of memory blocks; and a controller suitable for selecting one or more first memory blocks based on a predetermined condition among the plurality of the memory blocks in a booting section, and increasing a read reclaim count value of a second memory block, a number of failed bits of data read from which exceeds a predetermined threshold among the first memory blocks.

The controller may increase the read reclaim count value by adjusting a read reclaim count value increase range of the second memory block according to a current read reclaim count value of the second memory block.

The controller may increase the read reclaim count value by the read reclaim count value increase range of a relatively small amount when the current read reclaim count value is relatively small, and by the read reclaim count value increase range of a relatively great amount when the current read reclaim count value is relatively great.

The read reclaim count value increase range may be a predetermined first range when the current read reclaim count value is smaller than a predetermined first value. The read reclaim count value increase range may be a predetermined second range greater than the predetermined first range when the current read reclaim count value is greater than the predetermined first value and smaller than a predetermined second value. The read reclaim count value increase range may be a predetermined third range greater than the predetermined second range when the current read reclaim count value is greater than the predetermined second value.

Only when the booting section begins as a power supply is resumed after a sudden power-off (SPO) occurs, the controller may perform the operation of selecting the one or more first memory blocks among the plurality of the memory blocks, and the operation of increasing the read reclaim count value of the one or more second memory blocks.

The controller may select the first memory blocks based on an SPO occurrence number.

The controller may select the first memory blocks by comparing the SPO occurrence number and block address values of the plurality of memory blocks.

The controller may select the first memory blocks by randomly selecting a predetermined number of word lines coupled to the plurality of memory blocks and by selecting as the first memory blocks one or more memory blocks each including one or more of the selected word lines among the plurality of memory blocks.

The controller may further manage the first memory blocks through a round robin scheme or a linked list scheme in order to prevent a memory block from being repeatedly selected as the first memory blocks.

The controller may further determine whether to perform a read reclaim operation to one or more third memory blocks among the plurality of memory blocks based on the read reclaim count values of the third memory blocks when a predetermined operation is performed to the third memory blocks after completion of the booting section.

In accordance with another embodiment of the present invention, a method for operating a memory system including a memory device provided with a plurality of memory blocks may include: selecting one or more first memory blocks based on a predetermined condition among the plurality of the memory blocks in a booting section; and increasing a read reclaim count value of one or more second memory blocks, a number of failed bits of data read from which exceeds a predetermined threshold among the one or more first memory blocks.

The increasing of the read reclaim count value may include adjusting a read reclaim count value increase range of the one or more second memory blocks according to a current read reclaim count value of the one or more second memory blocks.

The read reclaim count value may be increased by the read reclaim count value increase range of a relatively small amount when the current read reclaim count value is relatively small, and by the read reclaim count value increase range of a relatively great amount when the current read reclaim count value is relatively great.

The read reclaim count value increase range may be a predetermined first range when the current read reclaim count value is smaller than a predetermined first value. The read reclaim count value increase range may be a predetermined second range greater than the predetermined first range when the current read reclaim count value is greater than the predetermined first value and smaller than a predetermined second value. The read reclaim count value increase range may be a predetermined third range greater than the predetermined second range when the current read reclaim count value is greater than the predetermined second value.

Only when the booting section begins as a power supply is resumed after a sudden power-off (SPO) occurs, the selecting the one or more first memory blocks among the plurality of the memory blocks; and the increasing the read reclaim count value of the one or more second memory blocks may be performed.

The first memory blocks may be selected based on an SPO occurrence number.

The first memory blocks may be selected by comparing the SPO occurrence number and block address values of the plurality of memory blocks.

The selecting of the first memory blocks may include: randomly selecting a predetermined number of word lines coupled to the plurality of memory blocks; and selecting as the first memory blocks one or more memory blocks each including one or more of the selected word lines among the plurality of memory blocks.

The method may further include managing the first memory blocks through a round robin scheme or a linked list scheme in order to prevent a memory block from being repeatedly selected as the first memory blocks.

The method may further include determining whether to perform a read reclaim operation to one or more third memory blocks among the plurality of memory blocks based on the read reclaim count values of the third memory blocks when a predetermined operation is performed to the third memory blocks after completion of the booting section.

DETAILED DESCRIPTION

Figure 1:
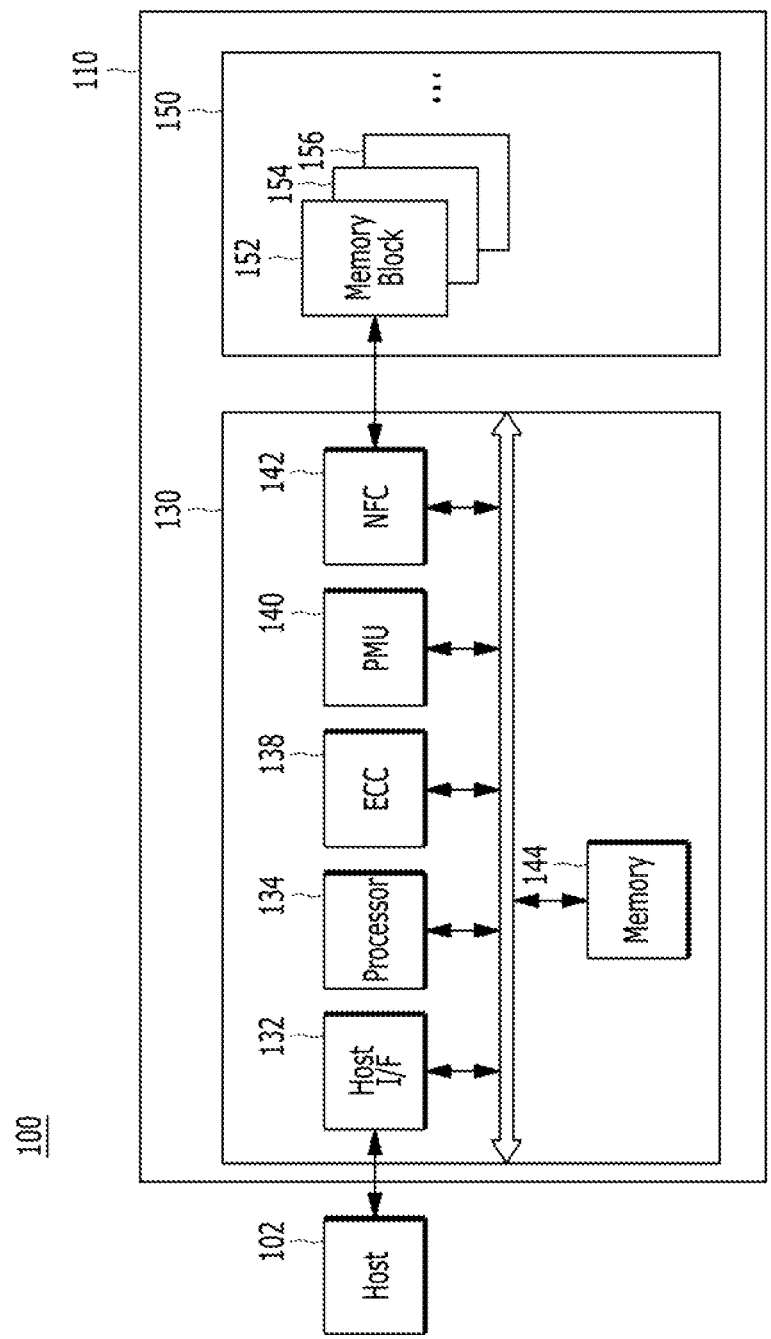
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may be any suitable electronic device including a portable electronic device such as a mobile phone, an MP3 player and a laptop computer or a non-portable electronic device such as a desktop computer, a game machine, a TV and a projector.

The host 102 may include at least one OS (operating system), and the OS may manage and control overall functions and operations of the host 102, and provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. At this time, the host 102 may include a plurality of OSs, and execute an OS to perform an operation corresponding to a user's request on the memory system 110.

The memory system 110 may operate to store data for the host 102 in response to a request received from the host 102. Non-limited examples of the memory system 110 may include a solid-state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may employ various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control storing data into the memory device 150 and reading data from the memory device 150 and transferring the read data to the host HOST.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line. In an embodiment, the memory device 150 may be a flash memory. The flash memory may have a 3-dimensional (3D) stack structure.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a memory device controller such as a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through any suitable method included a coded modulation such as Low-Density Parity Check (LDPC) code, Bose-Chaudhuri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices needed for error correction.

The PMU 140 may provide and manage power of the controller 130. Any suitable PMU may be employed.

The NFC 142 is an example of a suitable memory/storage interface for interfacing the controller 130 and the memory device 150 such that the controller 130 controls the memory device 150 in response to a request from the host 102, when the memory device is a NAND flash memory. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150. A suitable memory/storage interface may be selected depending upon the type of the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random-access memory (SRAM) or dynamic random-access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to a characteristic of the memory device, for example, a NAND flash memory during a program operation, among the plurality of memory blocks 152 to 156 included in the memory device 150. The management unit may write the program-failed data of the bad block to a new memory block. In a memory device 150 having a 3D stack structure, the bad block management operation may reduce the use efficiency of the memory device 150 and the reliability of the memory system 110. Thus, the bad block management operation needs to be performed with more reliability.

Figure 2:
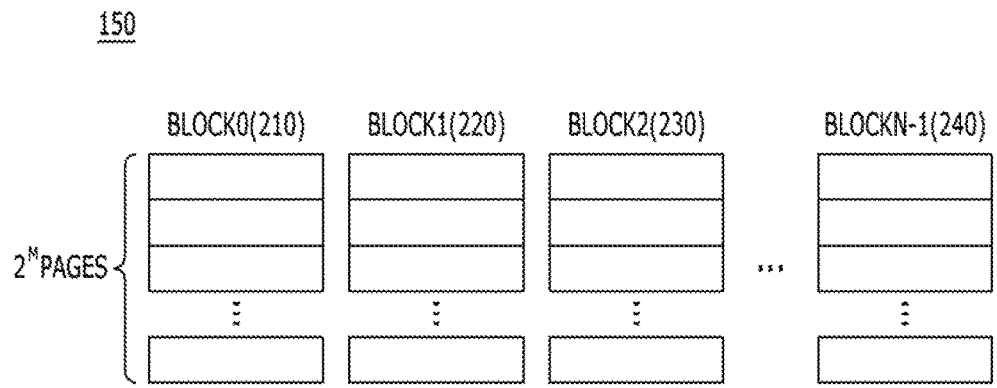
FIG. 2 is a schematic diagram illustrating an exemplary configuration of a memory device employed in the memory system of FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, a triple level cell (TLC) storing 3-bit data, a quadruple level cell (QLC) storing 4-bit level cell, a multiple level cell storing 5-or-more-bit data, and so forth.

Figure 3:
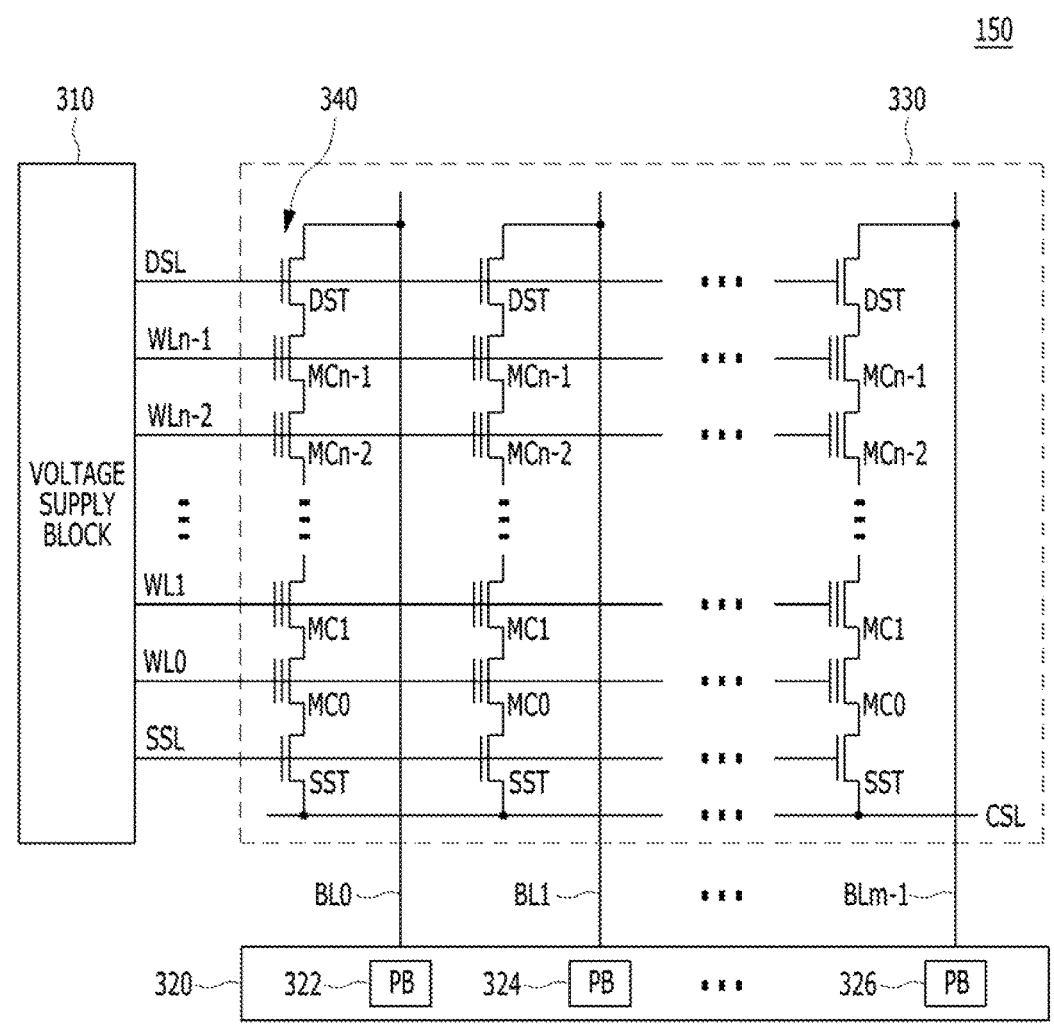
FIG. 3 is a circuit diagram illustrating an exemplary configuration of a memory cell array of a memory block in the memory device of FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
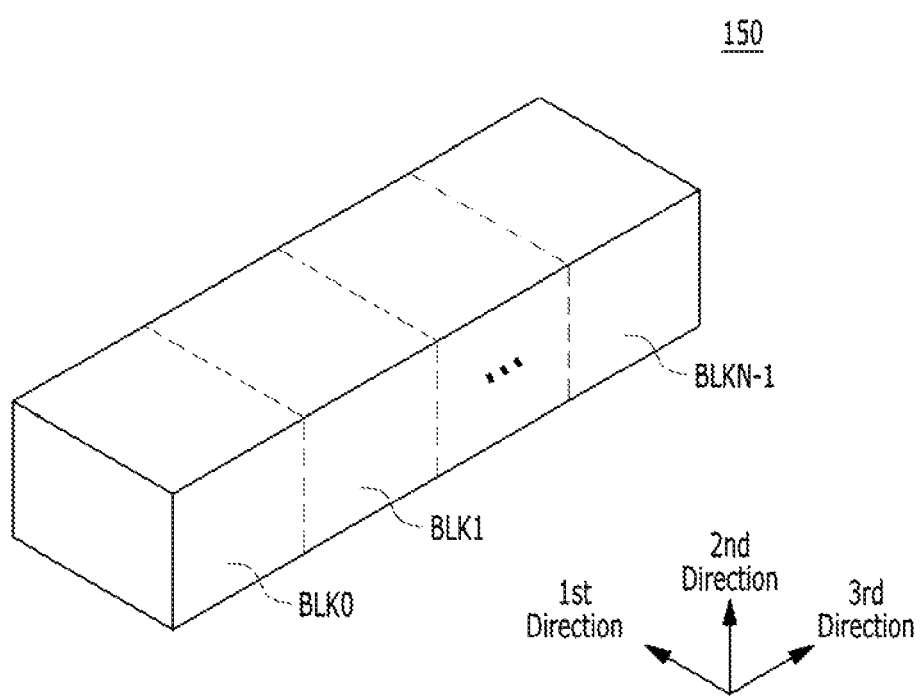
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Figure 5:
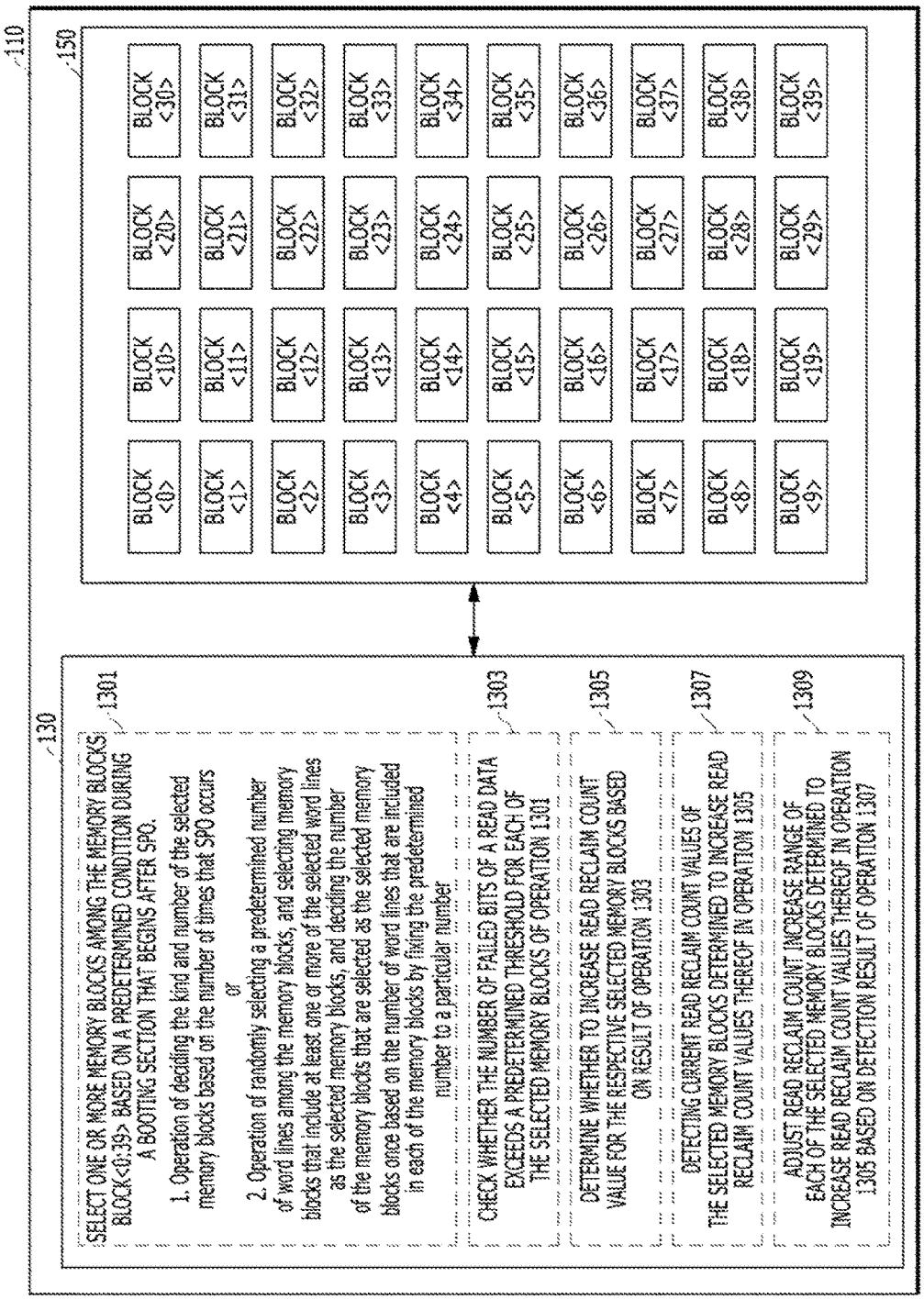
FIG. 5 is a block diagram illustrating an exemplary configuration of the memory system shown in FIG. 1.

FIG. 5 is a block diagram illustrating an exemplary configuration of the memory system 110, according to an embodiment of the present invention. The memory system 110 may include the controller 130 and the memory device 150 as described with reference to FIGS. 1 to 4. The memory device 150 may exemplarily include a plurality of memory blocks, for example, memory blocks BLOCK<0:39>.

The controller 130 may perform an operation 1301 of selecting one or more memory blocks among the memory blocks BLOCK<0:39> based on a predetermined condition in a booting section that begins after an SPO. Also, the controller 130 may perform an operation 1303 of checking whether or not a number of failed bits of a read data exceeds a predetermined threshold for each of 'the selected memory blocks' that are selected in operation 1301. Also, the controller 130 may perform an operation 1305 of determining whether to increase a read reclaim count value for the respective selected memory blocks based on the result of operation 1303. Also, the controller 130 may perform an operation 1307 of detecting current read reclaim count values of the selected memory blocks, which are determined to increase read reclaim count values thereof in operation 1305. Also, the controller 130 may perform an operation 1309 of adjusting a read reclaim count increase range of each of the selected memory blocks, which are determined to require an increase in the read reclaim count values thereof in operation 1305 based on detection result of operation 1307.

The operation of the controller 130, which is described above, may be described in further detail below by taking an example.

It is assumed that the booting section begins after a sudden power-off (SPO). In other words, the operations 1301, 1303, 1305, 1307 and 1309 of the controller 130 may be performed in a booting section after an SPO occurs.

During operation 1301, the controller 130 may select one or more memory blocks among the memory blocks BLOCK<0:39> based on the predetermined condition in a booting section.

In an embodiment, the controller 130 may select one or more memory blocks among the memory blocks BLOCK<0:39> According to a first method, the kind and number of the memory blocks that are selected as 'the selected memory blocks' among the memory blocks BLOCK<0:39> may be decided based on the number of times that the sudden power-off occurs, hereinafter also referred to as the SPO occurrence number. In other words, the controller 130 may count the SPO occurrence number, and select 'the selected memory blocks' among the memory blocks BLOCK<0:39> based on the SPO occurrence number.

For example, the controller 130 may count SPO occurrence number, compare the SPO occurrence number with the block address values of each of the memory blocks BLOCK<0:39>, and select memory blocks among the memory blocks BLOCK<0:39> based on the comparison result.

For example, the controller 130 may select a memory block for which a last digit of a corresponding block address coincides with a last digit of the SPO occurrence number among the memory blocks BLOCK<0:39> in operation 1301.

Referring to FIG. 5, when the memory device 150 includes a total of 40 memory blocks BLOCK<0:39> and a booting section begins after the SPO occurs for the first time, the four memory blocks having a last digit '1' in block addresses thereof (i.e., the first block BLOCK<1>, the $11^{th}$ block BLOCK<11>, the $21^{st}$ block BLOCK<21>, and the $31^{st}$ block BLOCK<31>) may be selected among the memory blocks BLOCK<0:39> during operation 1301. Likewise, when a booting section begins after the sudden power-off occurs for the seventh time, the four memory blocks having a block address ending with '7', which are the seventh block BLOCK<7>, the $17^{th}$ block BLOCK<17>, the 27th block BLOCK<27>, and the $37^{th}$ block BLOCK<37>, may be selected as 'the selected memory blocks'. When the memory blocks are selected among the memory blocks BLOCK<0:39> based on the SPO occurrence number, all the memory blocks BLOCK<0:39> may be selected once for every cycle of 10 SPOs.

For another example, the controller 130 may select a memory block for which a last digit of a corresponding block address coincide with last digits of the SPO occurrence number and a predetermined value K plus the SPO occurrence number among the memory blocks BLOCK<0:39> in operation 1301. Herein, the K may be an arbitrary number greater than '1'.

Referring to FIG. 5, when it is assumed that the memory device 150 includes a total of 40 memory blocks BLOCK<0:39> and the predetermined value K is 5 and a booting section begins after the SPO occurs for the first time, the eight memory blocks having last digits '1' and '6' (i.e., last digits of the SPO occurrence number and the predetermined value 5 plus the SPO occurrence number) in block addresses thereof (i.e., the first block BLOCK<1>, the sixth block BLOCK<6>, the $11^{th}$ block BLOCK<11>, the $16^{th}$ block BLOCK<16>, the $21^{st}$ block BLOCK<21>, the $31^{st}$ block BLOCK<31>, and the $36^{th}$ block BLOCK<36>) among the memory blocks BLOCK<0:39> during operation 1301. Likewise, when a booting section begins after the sudden power-off occurs for the seventh time, the eight memory blocks whose block address ends with '7' and '2', which are the second block BLOCK<2>, the seventh block BLOCK<7>, the $12^{th}$ block BLOCK<12>, the $17^{th}$ block BLOCK<17>, the $22^{nd}$ block BLOCK<22>, the $27^{th}$ block BLOCK<27>, the $32^{nd}$ block BLOCK<32>, and the $37^{th}$ block BLOCK<37>, may be selected as 'the selected memory blocks'. When the memory blocks are selected among the memory blocks BLOCK<0:39> based on the SPO occurrence number, all the memory blocks BLOCK<0:39> may be selected once whenever the SPO occurs at a cycle of 5 times, which may be adjusted based on the predetermined value K.

In another embodiment, the controller 130 may randomly select a predetermined number of word lines and select one or more memory blocks each including one or more of the selected word lines among the memory blocks BLOCK<0:39>.

Herein, the number of the memory blocks that are selected as 'the selected memory blocks' among the memory blocks BLOCK<0:39> may be controlled based on the number of word lines that are included in each of the memory blocks BLOCK<0:39> by fixing the predetermined number to a particular value.

Through the operation of fixing the predetermined number to a particular value, the number of the memory blocks that are selected as 'the selected memory blocks' among the memory blocks may be able to be controlled based on the number of the word lines that are included in each of the memory blocks BLOCK<0:39> for the following reason.

A number of the word lines included in each of the memory blocks BLOCK<0:39> may vary according to a type of the memory device 150.

Therefore, by selecting word lines as many as the predetermined number, a number of selected memory blocks may be adjusted. In other words, the controller 130 may control the number of selected memory blocks among the memory blocks BLOCK<0:39> through the predetermined number of selected word lines in operation 1301.

The fact that the number of the word lines included in each of the memory blocks BLOCK<0:39> may be different may mean that if the total number of the target word lines to be read in a booting section beginning after a sudden power-off is fixed to a predetermined number, the number of the memory blocks that are selected as 'the selected memory blocks' among the memory blocks BLOCK<0:39> may be able to be controlled according to the number of the word lines that are included in each of the memory blocks BLOCK<0:39>.

For example, it may be assumed that a booting section begins after a sudden power-off and the total number of the read target word lines is fixed to 20 and the 20 read target word lines are selected randomly. Herein, when relatively many word lines are included in each of the memory blocks BLOCK<0:39> in a memory device, the probability that two word lines are selected as the read target for one memory block is relatively high. Therefore, the probability that a small number of memory blocks are selected as 'the selected memory blocks' among the memory blocks BLOCK<0:39> is relatively high. Conversely, when a relatively small number of word lines are included in each of the memory blocks BLOCK<0:39> in a memory device, the probability that two word lines are selected as the read target for one memory block is relatively low. Therefore, the probability that many memory blocks are selected as 'the selected memory blocks' among the memory blocks BLOCK<0:39> is relatively high. As shown in the examples, it is possible to control the number of the memory blocks that are selected as 'the selected memory blocks' among the memory blocks BLOCK<0:39> through the operation of fixing the predetermined number of the word lines that become the read target to a particular value.

When selecting one or more memory blocks each including one or more of the selected word lines, there may be a probability that a particular memory block is repeatedly selected for each occurrence of the SPO. In accordance with an embodiment of the present invention, it is possible to prevent the repeated selection of a particular memory block by managing the selected memory blocks of operation 1301 through the round robin scheme or the linked list scheme, which are widely known.

During operation 1303, the controller 130 may control the memory device 150 to read data from the memory blocks selected in operation 1301 and may check whether a number of failed bits of the read data exceeds a predetermined threshold or not for each of the memory blocks selected in operation 1301.

During operation 1305, when there is at least one memory block for which data read has a number of failed bits exceeding the predetermined threshold among the memory blocks selected in operation 1301 as a result of the check operation 1303, the controller 130 may determine to increase a read reclaim count value of the memory block for which data read has a number of failed bits exceeding the predetermined threshold. The controller 130 may not determine to increase the read reclaim count value of a memory block for which data read has a number of failed bits under the predetermined threshold among the memory blocks selected in operation 1301 as the result of the check operation 1303.

During operation 1307, the controller 130 may detect current read reclaim count values of the memory blocks, which are determined to require an increase in the read reclaim count values thereof in operation 1305 among the memory blocks selected in operation 1301. The controller 130 may perform operation 1307 in order to find out whether the current read reclaim count value of each of the memory blocks, which are determined to require an increase in the read reclaim count values thereof in operation 1305, has a relatively small value or great value.

During operation 1309, the controller 130 may adjust a read reclaim count increase range of each of the memory blocks, which are determined to require an increase in the read reclaim count values thereof in operation 1305 among the memory blocks selected in operation 1301 based on the detected current read reclaim count values of operation 1307. In other words, when a memory block is checked out to have a relatively small current read reclaim count value among the memory blocks, which are determined to require an increase in the read reclaim count values thereof in operation 1305, the read reclaim count value of the memory block having the relatively small current read reclaim count value may be increased by a relatively small range. Conversely, when a memory block is checked out to have a relatively great current read reclaim count value among the memory blocks, which are determined to require an increase in the read reclaim count values thereof in operation 1305, the read reclaim count value of the memory block having the relatively great current read reclaim count value may be increased by a relatively great range.

For example, the memory blocks, which are determined to require an increase in the read reclaim count values thereof in operation 1305, may be divided into three groups according to the current read reclaim count value detected in operation 1307 and the increase range of the read reclaim count value may be adjusted based on the result of operation 1307. For first memory blocks determined to have the current read reclaim count values smaller than a predetermined first value (e.g., 100K), the read reclaim count values of the first memory blocks may be increased by a predetermined first range (e.g., 2K). For second memory blocks determined to have the current read reclaim count values between the predetermined first value and a predetermined second value (e.g., 200K), the read reclaim count values of the second memory blocks may be increased by a predetermined second range (e.g., 10K). For third memory blocks determined to have the current read reclaim count values greater than the predetermined second value, the read reclaim count values of the third memory blocks may be increased by a predetermined third range (e.g., 50K).

The controller 130 may perform operation 1309 of adjusting the read reclaim count increase range of each of the selected memory blocks, which are determined to require an increase in the read reclaim count values thereof in operation 1305 based on the detection result of operation 1307 because the greater the current read reclaim count value of a memory block becomes, the higher errors are likely to occur in the memory block. Operation 1309 may cause memory blocks which already have high current read reclaim count values to become read reclaim target memory blocks faster.

Figure 6:
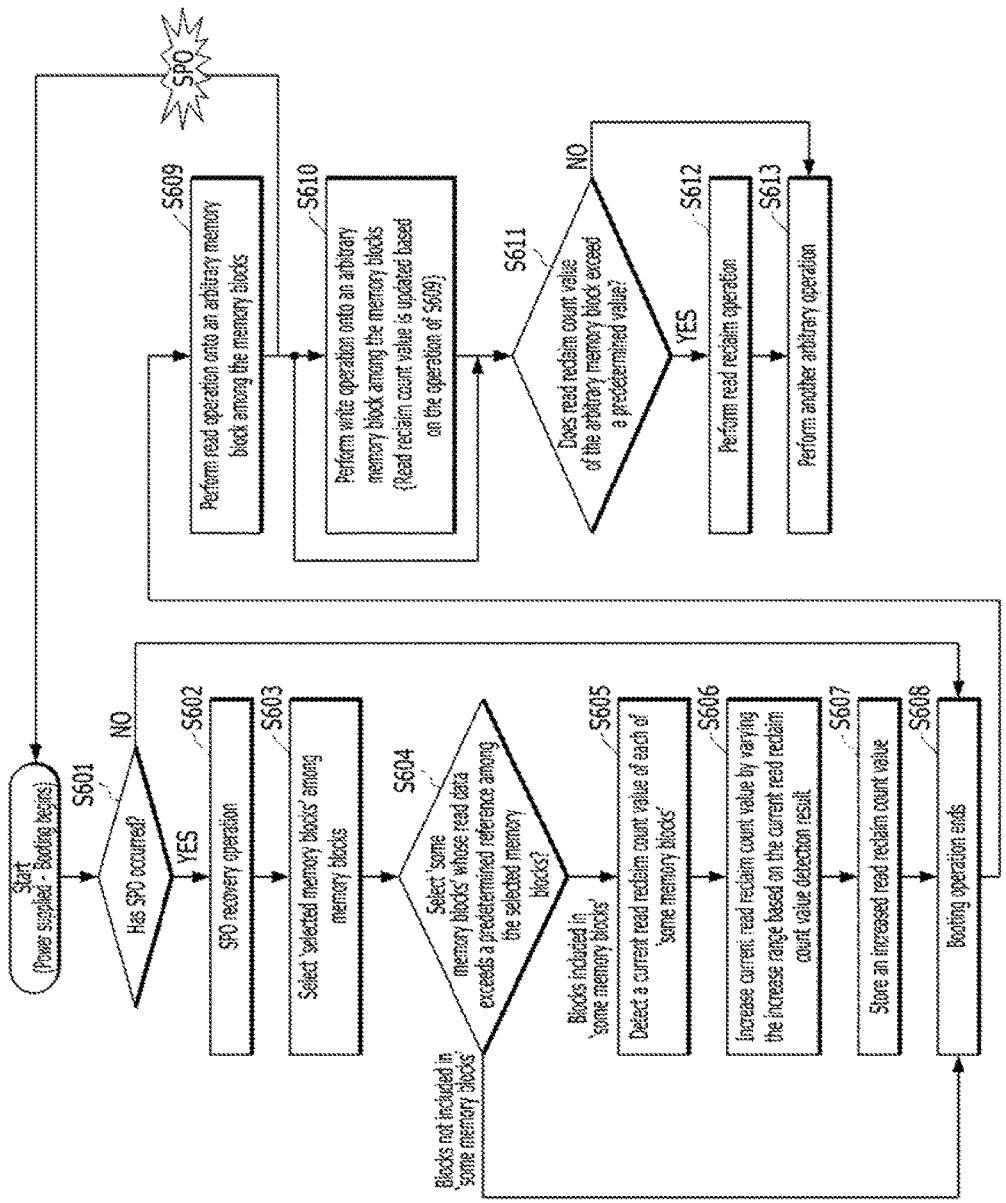
FIG. 6 is a flowchart illustrating an operation of the memory system shown in FIG. 5, in accordance with an embodiment of the present invention.

FIG. 6 is a flowchart illustrating an operation of the memory system 110 shown in FIG. 5.

Referring to FIG. 6, when a power source is supplied, the memory system 110 is booted up in step S600.

After the booting begins, it is decided whether or not the booting operation is performed after the occurrence of an SPO in step S601.

When it is decided in step S601 that the booting operation is not performed after an SPO (NO at step S601), the booting operation is performed and then finished in step S608.

When it is decided in step S601 that the booting operation is performed after an SPO (YES at step S601), an SPO recovery operation is performed due to the occurrence of the SPO in step S602.

Herein, the SPO recovery operation performed in step S602 may mean a general operation of recovering data that is processed by the memory system 110 when the SPO occurs.

After the SPO recovery operation performed in step S602 is finished, the controller 130 may perform operations 1301 to 1309 described above with reference to FIG. 5. In other words, the controller 130 may perform operation 1301 in step S603. Also, the controller 130 may perform operations 1303 and 1305 in step S604. Also, the controller 130 may perform operation 1307 in step S605. Also, the controller 130 may perform operation 1309 in step S606.

Herein, for the memory blocks, which are determined to require an increase in the read reclaim count values thereof in operation 1305 or step S604, steps S605, S606 and S607 may be performed and then the booting operation is finished in step S608. On the other hand, for the memory blocks, which are not determined to require an increase in the read reclaim count values thereof in operation 1305 or step S604, the booting operation is finished in step S608.

During step S607, the read reclaim count value of each of the memory blocks, which are determined to require an increase in the read reclaim count values thereof in operation 1305, may be stored in the memory device 150. The read reclaim count value to be stored in the memory device may be increased by the adjusted read reclaim count increase range in operation 1309 or step S606.

After operation 1301 to 1309 of the controller 130 described with reference to FIG. 5 may be performed through steps S603 to 607, the booting operation may be finished in step S608.

After the booting operation is finished in step S608, various operations including write and read operations of the memory system 110 may be performed. In the drawing, it is exemplarily shown that after the booting operation is finished in step S608, an SPO occurs again while a read operation is performed in step S609 onto an arbitrary memory block among the memory blocks BLOCK<0:39>. In short, the drawing exemplarily shows a case where after the booting operation is finished in step S608, an SPO occurs again while only a read operation is performed and a write operation is not performed.

It is noted that steps S603 to S607 or operations 1301 to 1309 are more advantageous when after a booting operation is finished in step S608, an SPO occurs again while only a read operation is performed and a write operation is not performed.

To be specific, when it is assumed that the booting operation is finished in step S608 and then no more SPO occurs while only a read operation is performed onto an arbitrary memory block among the memory blocks BLOCK<0:39>, steps S610, S611, S612, and S613 may be performed.

In step S610, a write operation is performed onto an arbitrary memory block among the memory blocks BLOCK<0:39>. Herein, the read reclaim count value is increased while a read operation is performed onto an arbitrary memory block in step S609, which is performed ahead of step S610. The increased read reclaim count value may be stored in the arbitrary memory block at a moment when the write operation is performed onto the arbitrary memory block in step S610. In other words, the read reclaim count value that is increased as a read operation is performed onto the arbitrary memory block in step S609 may be managed in the memory unit 144 which has volatile characteristics in the inside of the controller 130, and then, as step S610 is performed, the read reclaim count value may be stored in the arbitrary memory block having nonvolatile characteristics.

Therefore, as shown in the drawing, if step S609 is performed and an SPO occurs again before step S610 is performed, the read reclaim count value that is increased as the read operation is performed onto the arbitrary memory block in step S609 may not be stored in the arbitrary memory block but it is instead deleted.

If it is assumed that the phenomenon where step S609 is performed and an SPO occurs again before the step S610 is performed as illustrated in the drawing occurs repeatedly and a controller does not perform steps S603 to S607, the arbitrary memory block which is a read target in step S609, may not have its read reclaim count value being increased, even if the read operation is performed continuously.

Therefore, if the controller 130 in accordance with the embodiment of the present invention described above performs steps S603 to S607, and the phenomenon where only step S609 is performed and an SPO occurs again before step S610 is performed, which is illustrated in the drawing, occurs repeatedly, the read reclaim count value for each of the memory blocks BLOCK<0:39> may be increased. In this way, it is possible to prevent a read operation from being repeated excessively onto an arbitrary memory block among the memory blocks BLOCK<0:39 and thereby causing an error.

In steps S611 and S612, a read reclaim operation may be performed for the memory system 110. In other words, in the memory system 110, the read reclaim count value for the arbitrary memory block among the memory blocks BLOCK<0:39> is checked out after the booting operation of the memory system 110 is finished in step S608 and then whether to perform the read reclaim operation may be decided based on the read reclaim count value.

Herein, the operation of selecting the arbitrary memory block among the memory blocks BLOCK<0:39> in step S611 may be performed at a moment when a read operation or a write operation is performed for the arbitrary memory block. In other words, as described in the drawing, step S611 may be performed after step S609 is performed, and step S611 may be performed after step S610 is performed.

Herein, to obtain an accurate result in step S611, the read reclaim count value may be able to be increased by a value corresponding to step S609 which is performed onto the arbitrary memory block.

In step S612, the read reclaim operation may be performed onto the arbitrary memory block among the memory blocks BLOCK<0:39>. Herein, the read reclaim operation may mean an operation of copying the data stored in the arbitrary memory block into another memory block. Since the read reclaim operation is a known operation, further description is not provided herein.

The read reclaim operation may be performed through step S612 based on the result of step S611, or step S613 may be performed through step S612 based on the result of step S611. Step S613 may mean all arbitrary operations that may be performed in the memory system 110.

Herein, even though an arbitrary memory block is selected as a memory block where a read reclaim operation is to be performed based on the result of step S611, step S612 does not have to be performed onto an arbitrary memory block instantly. In other words, when an arbitrary memory block that becomes a read reclaim target is selected through step S611, the read reclaim operation may be performed onto the arbitrary memory block through step S612 when the memory system 110 performs a background operation.

FIGS. 7 to 15 are diagrams schematically illustrating application examples of the data processing system 100.

Figure 7:
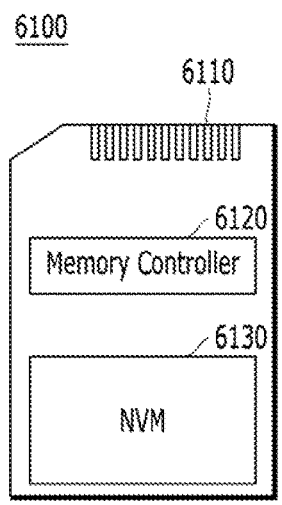
FIGS. 7 to 15 are diagrams schematically illustrating application examples of the data processing system of FIG. 1, in accordance with various embodiment of the present invention.

FIG. 7 is a diagram schematically illustrating another example of the data processing system including the memory system in accordance with the present embodiment. FIG. 7 schematically illustrates a memory card system to which the memory system in accordance with the present embodiment is applied.

Referring to FIG. 7, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 8:
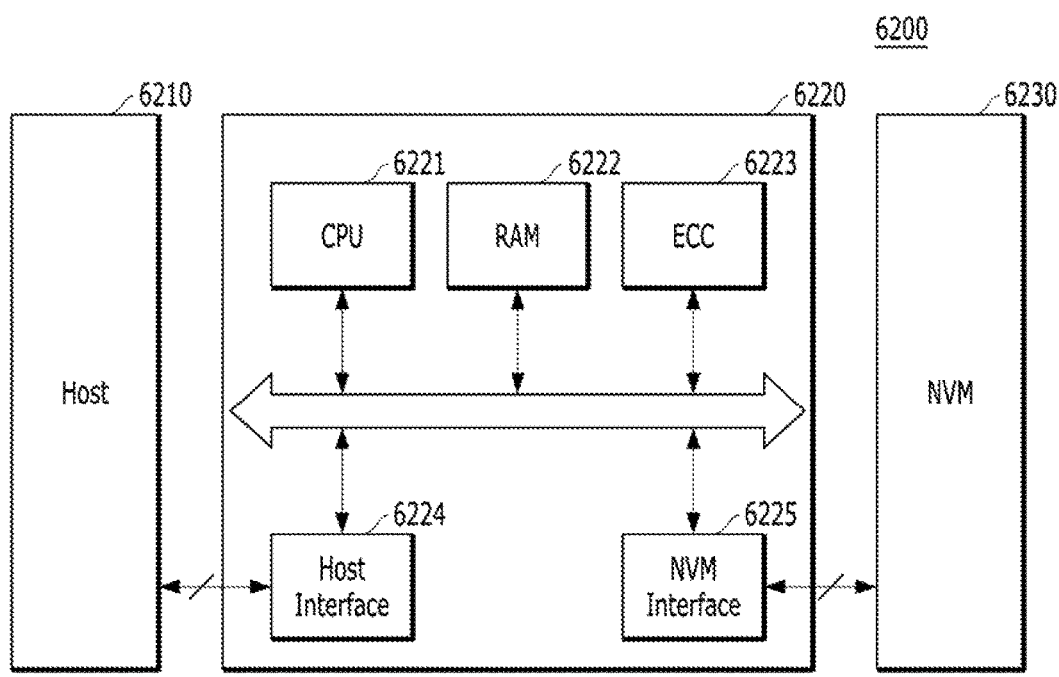

FIG. 8 is a diagram schematically illustrating another example of the data processing system including the memory system in accordance with the present embodiment.

Referring to FIG. 8, the data processing system 6200 may include a memory device 6230 having one or more nonvolatile memories and a memory controller 6220 for controlling the memory device 6230. The data processing system 6200 illustrated in FIG. 8 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 9:
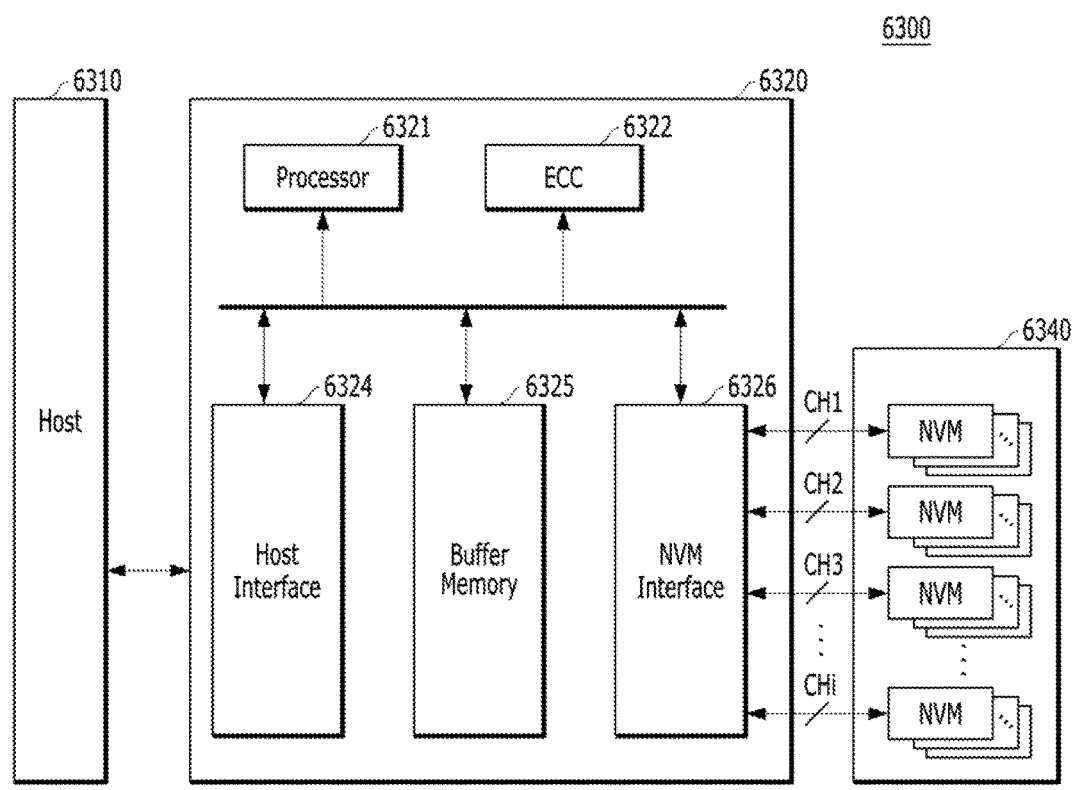

FIG. 9 is a diagram schematically illustrating another example of the data processing system including the memory system in accordance with the present embodiment. FIG. 9 schematically illustrates an SSD to which the memory system in accordance with the present embodiment is applied.

Referring to FIG. 9, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 8 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 10:
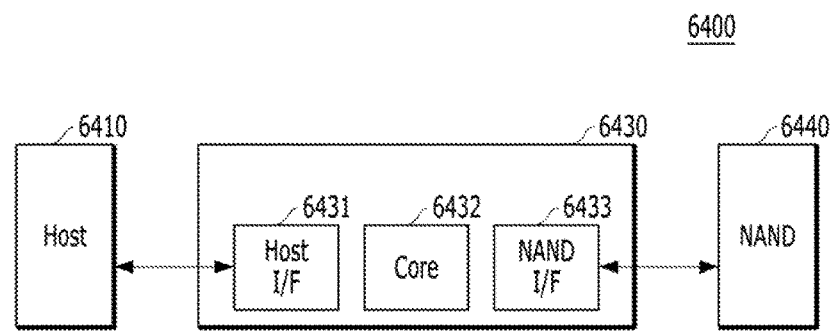

FIG. 10 is a diagram schematically illustrating another example of the data processing system including the memory system in accordance with the present embodiment. FIG. 10 schematically illustrates an embedded Multi-Media Card (eMMC) to which the memory system in accordance with the present embodiment is applied.

Referring to FIG. 10, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 11 to 14 are diagrams schematically illustrating other examples of the data processing system including the memory system in accordance with the present embodiment. FIGS. 11 to 14 schematically illustrate UFS (Universal Flash Storage) systems to which the memory system in accordance with the present embodiment is applied.

Referring to FIGS. 11 to 14, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 8 to 10, and the UFS cards 6530, 6630, 6730 and 6830 may be embodied in the form of the memory card system 6100 described with reference to FIG. 7.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 11:
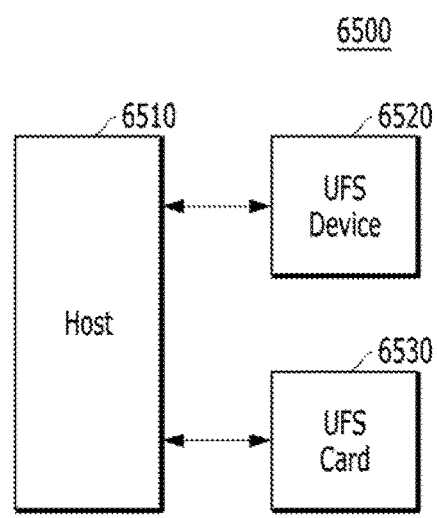

In the UFS system 6500 illustrated in FIG. 11, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 12:
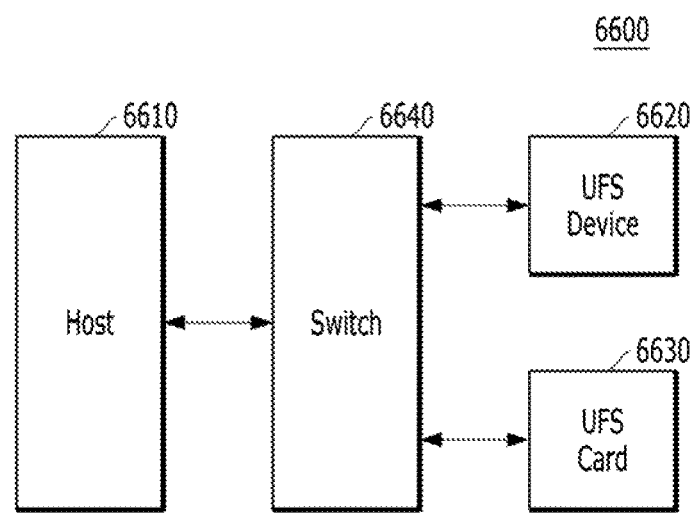

In the UFS system 6600 illustrated in FIG. 12, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 13:
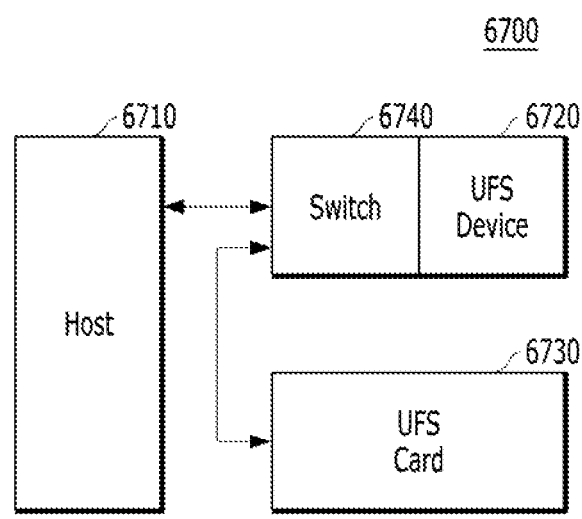

In the UFS system 6700 illustrated in FIG. 13, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 14:
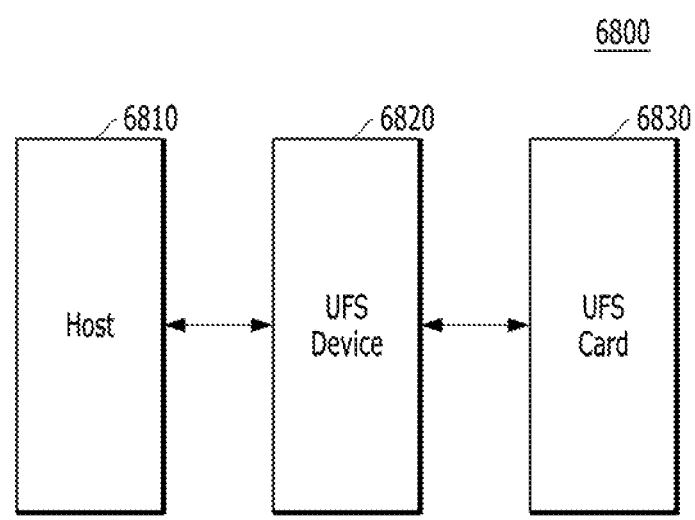

In the UFS system 6800 illustrated in FIG. 14, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 15:
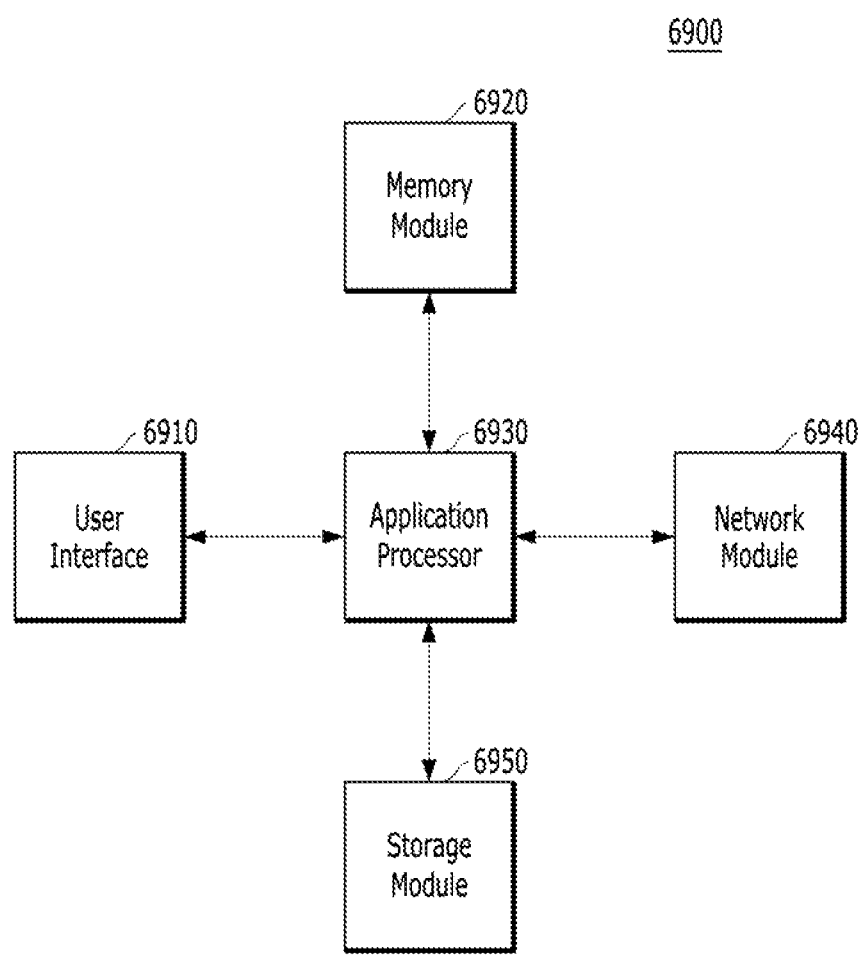

FIG. 15 is a diagram schematically illustrating another example of the data processing system including the memory system in accordance with an embodiment. FIG. 15 is a diagram schematically illustrating a user system to which the memory system in accordance with the present embodiment is applied.

Referring to FIG. 15, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, eMMC and UFS as described above with reference to FIGS. 9 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to the embodiment of the present invention, which is described above, a read operation for a test may be performed in a booting section that begins after a SPO occurs and then the read reclaim count value may be varied and stored based on the result of the read operation. In this way, the read reclaim operation may be stably supported even when SPO occurs repeatedly.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
a memory device including a plurality of memory blocks; and
a controller configured to select one or ore first memory blocks based on a predetermined condition among the plurality of the memory blocks in a booting section, and select one or more second memory blocks among the one or more first memory blocks when a number of failed bits of each read data outputted from the one or more first memory blocks exceeds a predetermined threshold,
wherein the controller determines a different read reclaim count value increase amount based on a read reclaim count value of the second memory block being within one of a plurality of different criterion ranges, and adds the different read reclaim count value increase amount the read reclaim count value of the second memory block.

2. The memory system of claim 1, wherein the read reclaim count value increase amount for a second memory block becomes smaller as the second memory block has a smaller current read reclaim count value than another second memory block.

3. The memory system of claim 2,
wherein the read reclaim count value increase amount is a predetermined first amount when the current read reclaim count value is smaller than a predetermined first value,
wherein the read reclaim count value increase amount is a predetermined second amount greater than the predetermined first amount when the current read reclaim count value is greater than the predetermined first value and smaller than a predetermined second value, and
wherein the read reclaim count value increase amount is a predetermined third amount greater than the predetermined second amount when the current read reclaim count value is greater than the predetermined second value.

4. The memory system of claim 1, wherein only when the booting section begins as a power supply is resumed after a sudden power-off (SPO) occurs, the controller performs the operation of selecting the one or more first memory blocks among the plurality of the memory blocks, the operation of selecting the one or more second memory blocks among the one or more first memory blocks, and the operation of determining the different read reclaim count value increase amount and adding the different read reclaim count value increase amount to the second memory block.

5. The memory system of claim 4, wherein the controller selects the first memory blocks based on an SPO occurrence number.

6. The memory system of claim 5, wherein the controller selects the first memory blocks by comparing the SPO occurrence number and block address values of the plurality of memory blocks.

7. The memory system of claim 4, wherein the controller selects the first memory blocks by randomly selecting a predetermined number of word lines coupled to the plurality of memory blocks and by selecting as the first memory blocks one or more memory blocks each including one or more of the selected word lines among the plurality of memory blocks.

8. The memory system of claim 7, wherein the controller further manages the first memory blocks through a round robin scheme or a linked list scheme in order to prevent a memory block from being repeatedly selected as the first memory blocks.

9. The memory system of claim 1, wherein the controller further determines whether to perform a read reclaim operation to one or more third memory blocks among the plurality of memory blocks based on the read reclaim count values of the third memory blocks when a predetermined operation is performed to the third memory blocks after completion of the booting section.

10. A method for operating a memory system including a memory device provided with a plurality of memory blocks, the method comprising:

selecting one or more first memory blocks based on a predetermined condition among the plurality of the memory blocks in a booting section;

selecting one or more second memory blocks among the one or more first memory blocks when a number of failed bits of each data read outputted from the one or more first memory blocks exceeds a predetermined threshold, determining a different read reclaim count value increase amount based on a read reclaim count value of the second memory block being within one of a plurality of different criterion ranges, and adding the different read reclaim count value increase amount to the read reclaim count value of the second memory block.

11. The method of claim 10, wherein the read reclaim count value increase amount for a second memory block becomes smaller as the second memory block has a smaller current read reclaim count value than another second memory block.

12. The method of claim 11, wherein the read reclaim count value increase amount is a predetermined first amount when the current read reclaim count value is smaller than a predetermined first value, wherein the read reclaim count value increase amount is a predetermined second amount greater than the predetermined first amount when the current read reclaim count value is greater than the predetermined first value and smaller than a predetermined second value, and wherein the read reclaim count value increase amount is a predetermined third amount greater than the predetermined second amount when the current read reclaim count value is greater than the predetermined second value.

13. The method of claim 10, wherein only when the booting section begins as a power supply is resumed after a sudden power-off (SPO) occurs, the selecting the one or more first memory blocks among the plurality of the memory blocks;

the selecting the one or more second memory blocks among the one or more first memory blocks; and the determining the different read reclaim count value increase amount, and the adding the different read reclaim count value increase amount to the read reclaim count value of the second memory block, are performed.

14. The method of claim 13, wherein the first memory blocks are selected based on SPO occurrence number.

15. The method of claim 14, wherein the first memory blocks are selected by comparing the SPO occurrence number and block address values of the plurality of memory blocks.

16. The method of claim 13, wherein the selecting of the first memory blocks includes:

randomly selecting a predetermined number of word lines coupled to the plurality of memory blocks; and selecting as the first memory blocks one or more memory blocks each including one or more of the selected word lines among the plurality of memory blocks.

17. The method of claim 16, further comprising managing the first memory blocks through a round robin scheme or a linked list scheme in order to prevent a memory block from being repeatedly selected as the first memory blocks.

18. The method of claim 10, further comprising determining whether to perform a read reclaim operation to one or more third memory blocks among the plurality of memory blocks based on the read reclaim count values of the third memory blocks when a predetermined operation is performed to the third memory blocks after completion of the booting section.

* * * * *